(12) United States Patent
Huang

(10) Patent No.: US 11,783,769 B2
(45) Date of Patent: Oct. 10, 2023

(54) DISPLAY DEVICE AND DISPLAY METHOD

(71) Applicant: WUHAN CHINA STAR OPTOELECTRONICS SEMICONDUCTOR DISPLAY TECHNOLOGY CO., LTD., Wuhan (CN)

(72) Inventor: Peng Huang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 505 days.

(21) Appl. No.: 17/041,397

(22) PCT Filed: Jun. 23, 2020

(86) PCT No.: PCT/CN2020/097793
§ 371 (c)(1),
(2) Date: Sep. 24, 2020

(87) PCT Pub. No.: WO2021/248562
PCT Pub. Date: Dec. 16, 2021

(65) Prior Publication Data
US 2023/0122237 A1 Apr. 20, 2023

(30) Foreign Application Priority Data

Jun. 9, 2020 (CN) .......................... 202010517931.4

(51) Int. Cl.
*G09G 3/3208* (2016.01)
*G09G 3/00* (2006.01)
*H05K 5/02* (2006.01)

(52) U.S. Cl.
CPC .......... *G09G 3/3208* (2013.01); *G09G 3/035* (2020.08); *H05K 5/0217* (2013.01);
(Continued)

(58) Field of Classification Search
CPC ................ G09G 3/3208; G09G 3/035; G09G 2320/0257; G09G 2320/046; G09G 2320/103; H05K 5/0217
See application file for complete search history.

(56) References Cited

U.S. PATENT DOCUMENTS

| | | | | |
|---|---|---|---|---|
| 2008/0212271 | A1* | 9/2008 | Misawa | G09F 9/35 361/679.01 |
| 2012/0050075 | A1* | 3/2012 | Salmon | G06F 1/1626 361/679.01 |

(Continued)

FOREIGN PATENT DOCUMENTS

| | | |
|---|---|---|
| CN | 103310718 A | 9/2013 |
| CN | 104737100 A | 6/2015 |

(Continued)

*Primary Examiner* — Ricardo Osorio
(74) *Attorney, Agent, or Firm* — PV IP PC; Wei Te Chung; Zhigang Ma

(57) ABSTRACT

A display device and a display method are provided. The display device includes a bendable display screen and a retractable device. The bendable display screen can move relative to a housing of the display device using the retractable device. When a static image is displayed, a display area of the static image in the bendable display screen is changed by movement of the bendable display screen and adjustment of the display position without the premise of changing a position of the static image relative to the housing of the display device.

17 Claims, 3 Drawing Sheets

```
┌─────────────────────────────────────────┐
│ It is determined whether an image       │ ─ S101
│ displayed by the bendable display       │
│ screen is a static image.               │
└─────────────────────────────────────────┘
                    │
                    ▼
┌─────────────────────────────────────────┐
│ When the image displayed by the bendable│
│ display screen is the static image, the │
│ retractable device drives the bendable  │
│ display screen to move relative to a    │
│ housing of the display device, and a    │
│ display position of the image in the    │ ─ S102
│ bendable display screen is moved        │
│ simultaneously, in a direction opposite │
│ to a moving direction of the bendable   │
│ display screen, for a distance equal to │
│ a moving distance of the bendable       │
│ display screen, so that a position of   │
│ the image relative to the housing of    │
│ the display device is fixed.            │
└─────────────────────────────────────────┘
```

(52) U.S. Cl.
    CPC ............... *G09G 2320/0257* (2013.01); *G09G 2320/046* (2013.01); *G09G 2320/103* (2013.01)

(56) References Cited

U.S. PATENT DOCUMENTS

| | | | | |
|---|---|---|---|---|
| 2016/0307545 A1* | 10/2016 | Lee | ................... | G09G 5/346 |
| 2018/0183947 A1 | 6/2018 | Song et al. | | |
| 2019/0012008 A1* | 1/2019 | Yoon | ................... | G06F 1/1652 |
| 2019/0384438 A1* | 12/2019 | Park | ................... | G06F 3/0482 |
| 2021/0185835 A1* | 6/2021 | Song | ................... | H05K 5/0017 |

FOREIGN PATENT DOCUMENTS

| | | | |
|---|---|---|---|
| CN | 106468970 A | | 3/2017 |
| CN | 106900036 A | * | 6/2017 |
| CN | 108257555 A | | 7/2018 |
| CN | 108648692 A | | 10/2018 |
| CN | 108766235 A | | 11/2018 |
| CN | 109491541 A | | 3/2019 |
| CN | 110033707 A | | 7/2019 |
| CN | 110196704 A | | 9/2019 |
| CN | 110211501 A | | 9/2019 |
| WO | 2018044033 A1 | | 3/2018 |

* cited by examiner

DISPLAY DEVICE AND DISPLAY METHOD

This application is a Notional Phase of PCT Patent Application No. PCT/CN2020/097793 having international filing date of Jun. 23, 2020, which claims the priority of Chinese Patent Application No. 202010517931.4, entitled "DISPLAY DEVICE AND DISPLAY METHOD", filed on Jun. 9, 2020 in the CNIPA (National Intellectual Property Administration, PRC), the disclosure of which is incorporated herein by reference in its entirety.

TECHNICAL FIELD

The present disclosure relates to a display technology field, and more particularly to a display device and a display method.

BACKGROUND

With the continuous development of display technology, images in display screens that people see are more colorful and gorgeous. However, when a static image is displayed in a display screen for a long time, brightness decay at some positions where brightness occurs frequently is greater than that at other positions. As such, when another image is displayed, the static image residues. This is called blur phenomenon.

For example, when an organic light emitting diode display screen freezes at the same image, brightness decay at some positions where brightness occurs frequently is greater than that at other positions. Blur phenomenon occurs at positions having a high contrast ratio. When pixel points are deteriorating seriously because the static image is displayed for a long time, a burn-in problem of the display screen that cannot be recovered occurs. Currently, although panel manufacturers adopts a method of refreshing a pixel panel automatically or a method of decreasing brightness of the static image automatically in response to the burn-in problem, the methods only can relieve the blur phenomenon or the burn-in phenomenon but cannot fundamentally solve the blur phenomenon and the burn-in phenomenon.

SUMMARY OF DISCLOSURE

When a static image is displayed at the same position in a display screen for a long time, a blue problem occurs easily. Display quality of the display screen is affected seriously. More seriously, a burn-in problem of the display screen occurs.

To solve the above-mentioned problems, solutions provided by the present disclosure are described as follows.

The present disclosure provides a display device, including a bendable display screen and a retractable device connected to the bendable display screen. The retractable device is configured to wind or release the bendable display screen to implement movement of the bendable display screen relative to a housing of the display device.

In the display device of the present disclosure, the display device further includes a control module. The control module is configured to determine whether an image displayed by the bendable display screen is a static image and to determine, according to a determination result, whether to generate an instruction for changing a display position of the image in the bendable display screen and an instruction for activating the retractable device.

In the display device of the present disclosure, the control module includes a detection module, and the detection module is configured to continuously detect whether an image of a current frame and an image of a next frame are the same.

In the display device of the present disclosure, the control module further includes a timer module, and the timer module is configured to count a number of frames that the same image occurs in the same position in the bendable display screen.

In the display device of the present disclosure, the control module further includes a determination module, and the determination module is configured to determine, according to the number of frames counted by the counter module, whether the image is the static image.

In the display device of the present disclosure, the control module further includes an output module, and the output module is configured to determine, according to the a determination result of the determination module, whether to output an instruction for changing the display position of the image in the bendable display screen and an instruction for activating the retractable device.

In the display device of the present disclosure, the retractable device includes rotation axes disposed at two opposite sides of the bendable display screen, and the sides of the bendable display screen is separable to be wound on the rotation axes and is wound or released with rotation of the rotation axes.

In the display device of the present disclosure, in the rotation axes disposed at the two opposite sides of the bendable display screen, at least one of the rotation axes disposed at the two opposite sides of the bendable display screen is connected to a rotating motor, and the rotating motor is configured to drive the rotation axes to rotate.

In the display device of the present disclosure, the bendable display screen is a flexible organic light emitting diode display screen.

The present disclosure further provides a display method applied to a display device. The display device includes a bendable display screen and a retractable device connected to the bendable display screen. The display method includes the following steps of:

determining whether an image displayed by the bendable display screen is a static image; and driving, when the image displayed by the bendable display screen is the static image, the bendable display screen to move relative to a housing of the display device by the retractable device, and a display position of the image in the bendable display screen moved simultaneously, in a direction opposite to a moving direction of the bendable display screen, for a distance equal to a moving distance of the bendable display screen, so that a position of the image relative to the housing of the display device is fixed.

In the display method of the present disclosure, the determining whether the image displayed by the bendable display screen is the static image includes the following steps of:

detecting, by a detection module, whether an image of a current frame and an image of a next frame are the same;

counting, by a counter module, a number of frames that the image of the current frame is continuously displayed, when the image of the current frame and the image of the next frame are the same; and determining, by a determination module, whether the number of frames, counted by the counter module, that the image of the current frame is continuously displayed is greater than a predetermined number of frames, and determining that the image is the static image in response that the number of frames that the image of the current frame is continuously displayed is greater than or equal to the predetermined number of frames.

In the display method of the present disclosure, the determining whether the image displayed by the bendable display screen is the static image further includes the following step of:

restarting to count by the counter module when the image of the current frame and the image of the next frame are different.

In the display method of the present disclosure, the determining whether the image displayed by the bendable display screen is the static image further includes the following step of:

determining that the image of the current frame is a non-static image when the number of frames that the image of the current frame is continuously displayed is smaller than the predetermined number of frames.

In the display method of the present disclosure, before the driving the bendable display screen to move relative to the housing of the display device by the retractable device, the display method further includes the following step of:

outputting, by an output module, an instruction for activating the retractable device to the retractable device and outputting an instruction for changing the display position of the image in the bendable display screen to the bendable display screen, when the determination module determines that the image of the current frame is the static image.

In the display method of the present disclosure, the retractable device includes rotation axes disposed at two opposite sides of the bendable display screen, and the rotation axes are connected to a rotating motor.

In the display method of the present disclosure, a method of the driving the bendable display screen to move by the retractable device includes:

driving, by the rotating motor, the rotation axes to rotate by the rotating motor; and winding, by the rotation axes, the bendable display screen on the rotation axes.

In the display method of the present disclosure, a method of the driving the bendable display screen to move by the retractable device includes:

driving, by the rotating motor, the rotation axes to rotate by the rotating motor; and releasing, by the rotation axes, the bendable display screen from the rotation axes.

The present disclosure further provides a display device including:

a housing;

a bendable display screen disposed in the housing;

a retractable device disposed in the housing, connected to the bendable display screen, and configured to wind or release the bendable display screen to implement movement of the bendable display screen relative to a housing of the display device; and a control module disposed in the housing and configured to determine whether an image displayed by the bendable display screen is a static image;

wherein when the control module determines that the image displayed by the bendable display screen is the static image, the control module controls the retractable device to drive the bendable display screen to move relative to the housing of the display device, and the control module simultaneously controls a display position of the image in the bendable display screen moved, in a direction opposite to a moving direction of the bendable display screen, for a distance equal to a moving distance of the bendable display screen, so that a position of the image relative to the housing of the display device is fixed.

Beneficial effect is described as follows. In the display device and the display method provided by the present disclosure, the bendable display screen can move relative to a housing of the display device using the retractable device. When a static image is displayed, a display area of the static image in the bendable display screen can be changed by movement of the bendable display screen and adjustment of the display position without the premise of changing a position of the static image relative to the housing of the display device. As such, a blur problem and a burn-in problem can be solved when a display screen displays a static image for a long time.

BRIEF DESCRIPTION OF DRAWINGS

In order to more clearly illustrate the embodiments or the technical schemes in the prior art, the following drawings of the embodiments or in the prior art will be briefly introduced. It is obvious that the drawings are merely some embodiments of the present disclosure, those skilled in the art may derive other drawings according the drawings described below without creative endeavor.

DETAILED DESCRIPTION OF EMBODIMENTS

Figure 1:
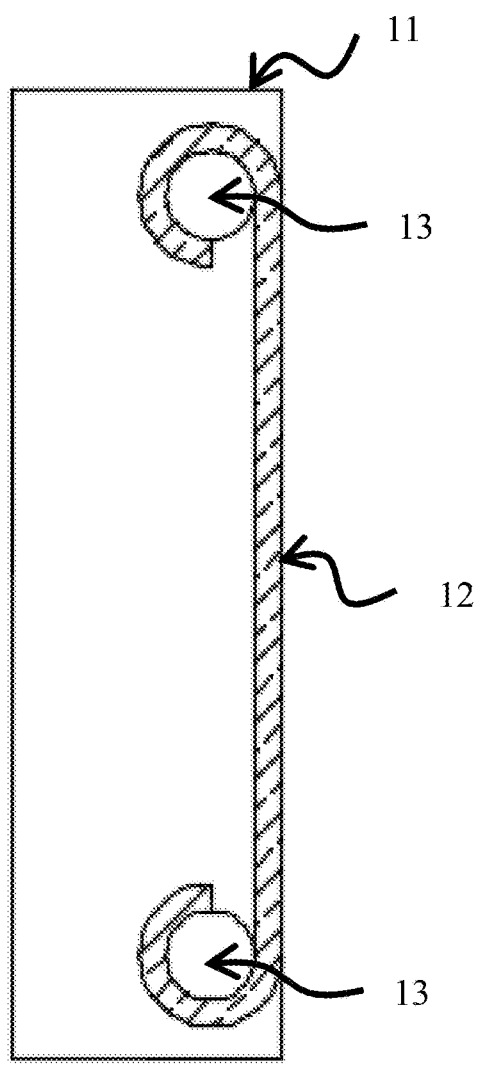
FIG. 1 illustrates a structural diagram of a first side of a display device provided by an embodiment of the present disclosure.

The following descriptions for the respective embodiments are specific embodiments capable of being implemented for illustrations of the present disclosure with referring to appended figures. For example, the terms "up", "down", "front", "rear", "left", "right", "interior", "exterior", "side", etcetera in the present disclosure are merely directions of referring to appended drawing. Therefore, the terms of directions are employed for explaining and understanding the present disclosure but not limitations thereto. In the drawings, the same reference numbers are used to refer to the same or like parts.

An embodiment of the present disclosure provides a display device. The display device includes a bendable display screen and a retractable device. The bendable display screen can move relative to a housing of the display device using the retractable device. When a static image is displayed, a display area of the static image in the bendable display screen is changed by movement of the bendable display screen and adjustment of the display position without the premise of changing a position of the static image relative to the housing of the display device. As such, a blur problem and a burn-in problem can be solved when a display screen displays a static image for a long time.

Figure 2:
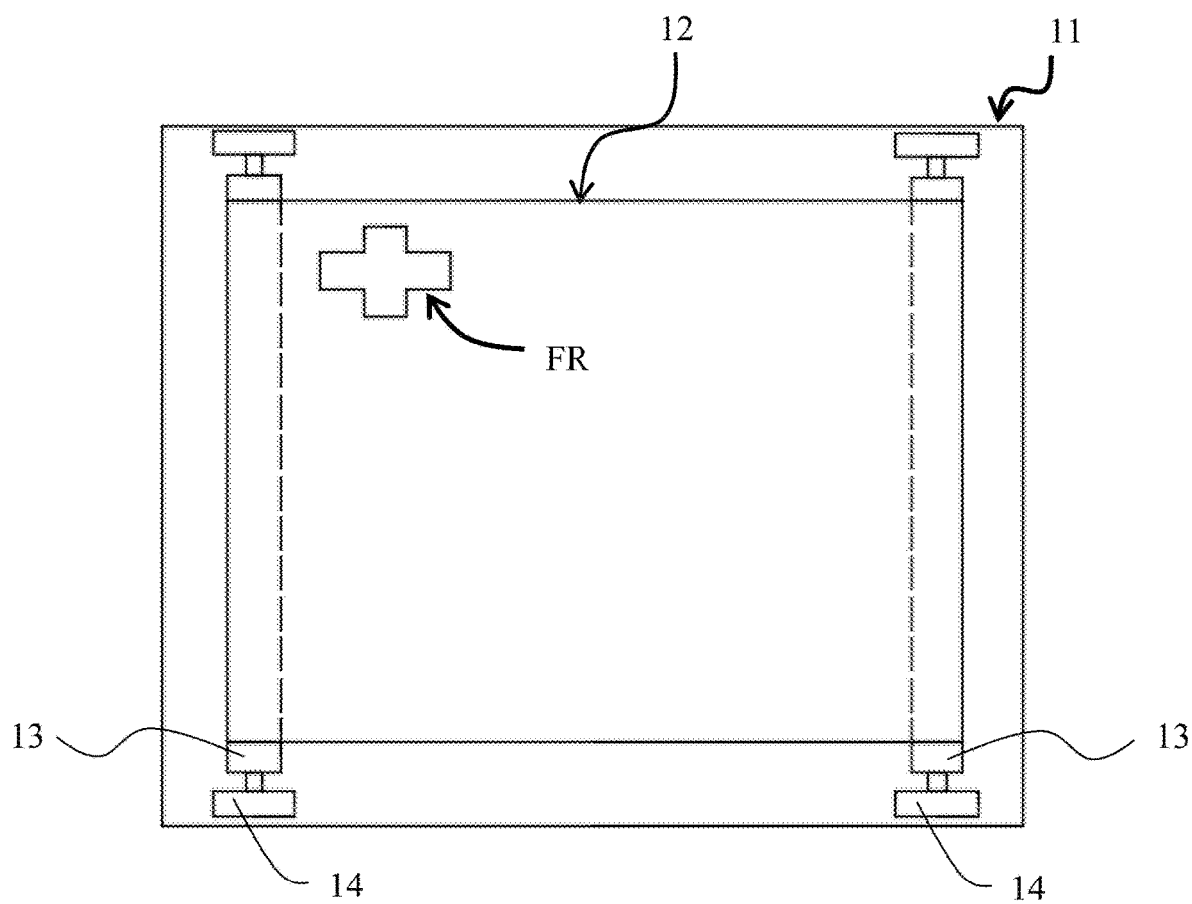
FIG. 2 illustrates a structural diagram of a second side of the display device provided by the embodiment of the present disclosure.

As shown in FIG. 1 and FIG. 2, FIG. 1 illustrates a structural diagram of a first side of a display device 10 provided by an embodiment of the present disclosure, while FIG. 2 illustrates a structural diagram of a second side of the display device 10 provided by the embodiment of the present disclosure. The display device 10 has a specific housing 11. The housing 11 forms an appearance shape of the display device 10 and is a supporting structure for various functional elements inside the display device 10 and configured to protect the various functional elements inside the display device 10 from being damaged by an external force.

The display device 10 includes a bendable display screen 12 and a retractable device 13 disposed in the housing 10. The bendable display screen 12 is disposed close to one surface of one side of the display device 10. A portion of the bendable display screen 12 which is exposed from the housing constitutes an active display area of the display device 10. The retractable device is connected to the bendable display screen 12 and configured to wind or release the bendable display screen 12 to implement movement of the bendable display screen 12 relative to the housing 11 of the display device 10.

It is noted that an area of the bendable display screen 12 is greater than an area of the active display area of the display device 10. A portion of the bendable display screen 12 beyond the active display area is wound on the retractable device 13. By winding and releasing actions of the retractable device 13, the bendable display screen 12 can be wound on the retractable device 13 or released from the retractable device 13, so that the bendable display screen 12 in the active display area has changeability. When the same image is displayed in the active display area for a long time, a position of the bendable display screen 12 in the active display area can be adjusted by the retractable device 13, thereby avoiding the blur problem or the burn-in problem when the same image is displayed in the same position for a long time.

Optionally, the bendable display screen 12 may be a flexible organic light emitting diode display screen.

Optionally, the retractable device 13 includes rotation axes disposed at two opposite sides of the bendable display screen 12, and the sides of the bendable display screen 12 is separable to be wound on the rotation axes and is wound or released with rotation of the rotation axes. It is noted that the rotation axes can be disposed at opposite left and right sides of the bendable display screen 12 or can be disposed at opposite upper and lower sides of the bendable display screen 12. When the rotation axes are disposed at the opposite left and right sides of the bendable display screen 12, a distance from a leftmost end to a rightmost end of the bendable display screen 12 is greater than a distance from a leftmost end to a rightmost end of the active display area. In the same manner, when the rotation axes are disposed at the opposite upper and lower sides of the bendable display screen 12, a distance from an uppermost end to a lowermost end of the bendable display screen 12 is greater than a distance from an uppermost end to a lowermost end of the active display area. The above-mentioned arrangement can implement that a portion of the bendable display screen 12 is wound on the rotation axes for convenience of winding and releasing operations.

Optionally, in the rotation axes disposed at the two opposite sides of the bendable display screen 12, at least one of the rotation axes is connected to a rotating motor 14. The rotating motor 14 is configured to drive the rotation axes to rotate to provide motive power for the winding and releasing operations of the bendable display screen 12.

Figure 3:
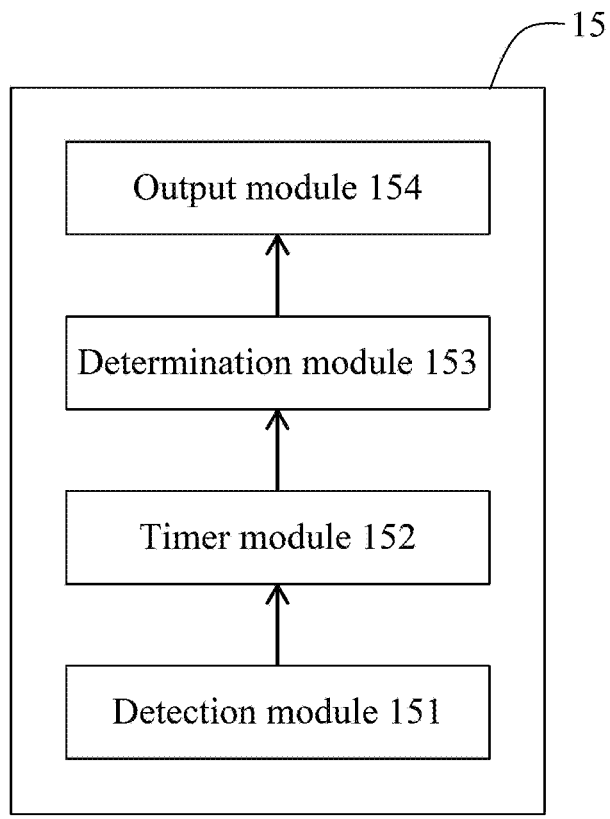
FIG. 3 illustrates an architecture diagram of a control module provided by an embodiment of the present disclosure.

Optionally, as shown in FIG. 3, FIG. 3 illustrates an architecture diagram of a control module provided by an embodiment of the present disclosure. The display device further includes a control module 15. The control module 15 is configured to determine whether an image displayed by the bendable display screen 12 is a static image and to determine, according to a determination result, whether to generate an instruction for changing a display position of the image in the bendable display screen 12 and an instruction for activating the retractable device 13.

Further, the control module 15 includes a detection module 151, a timer module 152, a determination module 153, and an output module 154. The detection module 151 is configured to continuously detect whether an image of a current frame and an image of a next frame are the same. The timer module 152 is configured to count a number of frames that the same image occurs in the same position in the bendable display screen 12. The determination module 153 is configured to determine, according to the number of frames counted by the counter module 152, whether the image is the static image. The output module 154 is configured to determine, according to a determination result of the determination module 153, whether to output an instruction for changing the display position of the image in the bendable display screen 12 and an instruction for activating the retractable device 13.

A working process is described as follows. The detection module 151 is configured to continuously detect whether an image FR of a current frame in a position of the bendable display screen 12 and an image of a next frame are the same. If yes, the timer module 152 is configured to count a number of frames that the image FR occurs in the same position in the bendable display screen 12. The determination module 153 is configured to determine whether the number of frames counted by the counter module 152 is greater than a predetermined number of frames. When the number of frames counted by the counter module 152 is greater than or equal to the predetermined number of frames, it is determined that the image FR is a static image. When it is determined that the image FR is the static image, the output module 154 is configured to output an instruction for activating the retractable device 13 to the retractable device 13 and an instruction for changing the position of the image FR in the bendable display screen 12. As such, the display position of the image FR in the bendable display screen 12 can be changed without the premise of changing a position of the image FR relative to the housing 11, thereby avoiding a blur problem and a burn-in problem when the bendable display screen 12 displays the same image in the same position for a long time.

It is noted that the predetermined number of frames is a fixed value preset in the determination module 153. The value can be acquired according to experiences or acquired by theoretical calculation according to a lifespan of the bendable display screen 12.

In summary, the display device provided by the embodiment of the present disclosure includes a bendable display screen and a retractable device. The bendable display screen can move relative to a housing of the display device using the retractable device. When a static image is displayed, a display area of the static image in the bendable display screen can be changed by movement of the bendable display screen and adjustment of the display position without the premise of changing a position of the static image relative to the housing of the display device. As such, a blur problem and a burn-in problem can be solved when a display screen displays a static image for a long time.

Figure 4:
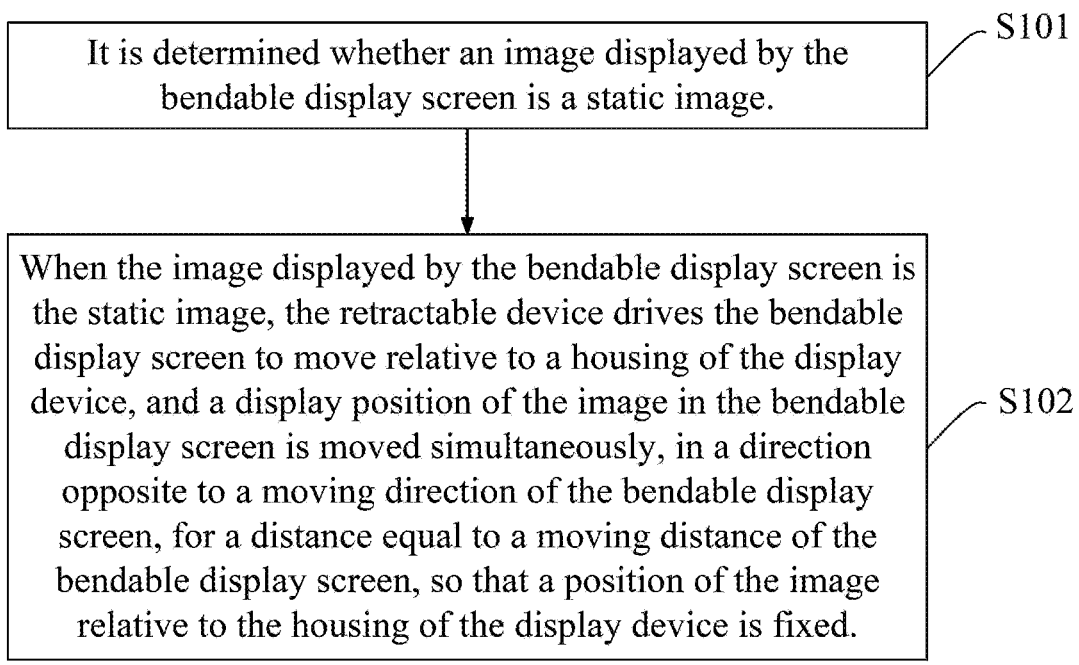
FIG. 4 illustrates a flowchart of a display method provided by an embodiment of the present disclosure.

Another embodiment of the present disclosure further provides a display method. Please refer to FIG. 1 to FIG. 4. FIG. 4 illustrates a flowchart of a display method provided by the embodiment of the present disclosure. The display method can be applied to the display device 10. The display device 10 includes a bendable display screen 12 and a retractable device 13 connected to the bendable display screen 12. The display method includes the following steps.

In step S101, it is determined whether an image FR displayed by the bendable display screen 12 is a static image.

In detail, step S101 includes the following steps.

A detection module 151 detects whether the image FR of a current frame in a position and an image of a next frame are the same.

When the image FR of the current frame and the image of the next frame are the same, a counter module 152 counts a number of frames that the image FR of the current frame is continuously displayed in the same position in the bendable display screen 12. When the image FR of the current frame and the image of the next frame are different, the counter module 152 restarts to count.

A determination module 153 determines whether the number of frames, counted by the counter module 152, that the image FR of the current frame is continuously displayed is greater than a predetermined number of frames. It is determined that the image FR of the current frame is the static image in response that the number of frames that the image FR of the current frame is continuously displayed is greater than or equal to the predetermined number of frames. In contrast, it is determined that the image FR of the current frame is a non-static image It is noted that the predetermined number of frames is a fixed value preset in the determination module 153. The value can be acquired according to experiences or acquired by theoretical calculation according to a life of the bendable display screen 12.

In step S102, when the image FR displayed by the bendable display screen 12 is the static image, the retractable device 13 drives the bendable display screen 12 to move relative to a housing 11 of the display device 10, and a display position of the image FR in the bendable display screen 12 is moved simultaneously, in a direction opposite to a moving direction of the bendable display screen 12, for a distance equal to a moving distance of the bendable display screen 12, so that a position of the image FR relative to the housing 11 of the display device 10 is fixed.

In detail, before the retractable device 13 drives the bendable display screen 12 to move relative to the housing 11 of the display device 10, the display method further includes the following step.

When the determination module 153 determines that the image FR of the current frame is the static image, an output module 154 outputs an instruction for activating the retractable device 13 to the retractable device 13 and outputs an instruction for changing the display position of the image FR in the bendable display screen 12 to the bendable display screen 12. The retractable device 13 and the bendable display screen 12 operate according to respective instructions.

Optionally, the retractable device 13 includes rotation axes disposed at two opposite sides of the bendable display screen 12, and the rotation axes are connected to a rotating motor 14. A method of the driving the bendable display screen 12 to move by the retractable device 13 include the following steps.

The rotating motor 14 drives the rotation axes to rotate.

The rotation axes wind the bendable display screen 12 on the rotation axes or releases the bendable display screen 12 from the rotation axes to implement movement of the bendable display screen 12 relative to the housing 11.

In summary, the display method provided by the embodiment of the present disclosure is applied to a display device including a bendable display screen and a retractable device. When it is determined that an image displayed by the display device is a static image, a display area of the static image in the bendable display screen can be changed by movement of the bendable display screen driven by the retractable device and proper adjustment of the display position in the bendable display screen without the premise of changing a position of the static image relative to the housing of the display device. As such, a blur problem and a burn-in problem can be solved when a display screen displays a static image for a long time.

In it noted that although the present disclosure has been provided in the embodiments described above, the foregoing embodiments are not intended to limit the present disclosure. Those skilled in the art, without departing from the spirit and scope of the present disclosure, may make modifications and variations, so the scope of the protection of the present disclosure is defined by the claims.

What is claimed is:

1. A display device, comprising:
   a bendable display screen;
   a retractable device connected to the bendable display screen, wherein the retractable device is configured to wind or release the bendable display screen to implement movement of the bendable display screen relative to a housing of the display device; and
   a control module, configured to determine whether an image displayed by the bendable display screen is a static image and to determine, according to a determination result, whether to generate an instruction for changing a display position of the image in the bendable display screen and an instruction for activating the retractable device.

2. The display device of claim 1, wherein the control module comprises a detection module, and the detection module is configured to continuously detect whether an image of a current frame and an image of a next frame are the same.

3. The display device of claim 2, wherein the control module further comprises a timer module, and the timer module is configured to count a number of frames that the same image occurs in the same position in the bendable display screen.

4. The display device of claim 3, wherein the control module further comprises a determination module, and the determination module is configured to determine, according to the number of frames counted by the counter module, whether the image is the static image.

5. The display device of claim 4, wherein the control module further comprises an output module, and the output module is configured to determine, according to the a determination result of the determination module, whether to output an instruction for changing the display position of the image in the bendable display screen and an instruction for activating the retractable device.

6. The display device of claim 1, wherein the retractable device comprises rotation axes disposed at two opposite sides of the bendable display screen, and the sides of the bendable display screen is separable to be wound on the rotation axes and is wound or released with rotation of the rotation axes.

7. The display device of claim 6, wherein in the rotation axes disposed at the two opposite sides of the bendable display screen, at least one of the rotation axes disposed at the two opposite sides of the bendable display screen is connected to a rotating motor, and the rotating motor is configured to drive the rotation axes to rotate.

8. The display device of claim 1, wherein the bendable display screen is a flexible organic light emitting diode display screen.

9. A display method, applied to a display device, the display device comprising a bendable display screen and a retractable device connected to the bendable display screen, and the display method comprising the following steps of:
determining whether an image displayed by the bendable display screen is a static image; and driving, when the image displayed by the bendable display screen is the static image, the bendable display screen to move relative to a housing of the display device by the retractable device, and a display position of the image in the bendable display screen moved simultaneously, in a direction opposite to a moving direction of the bendable display screen, for a distance equal to a moving distance of the bendable display screen, so that a position of the image relative to the housing of the display device is fixed.

10. The display method of claim 9, wherein the determining whether the image displayed by the bendable display screen is the static image comprises the following steps of:
detecting, by a detection module, whether an image of a current frame and an image of a next frame are the same; counting, by a counter module, a number of frames that the image of the current frame is continuously displayed, when the image of the current frame and the image of the next frame are the same; and determining, by a determination module, whether the number of frames, counted by the counter module, that the image of the current frame is continuously displayed is greater than a predetermined number of frames, and determining that the image is the static image in response that the number of frames that the image of the current frame is continuously displayed is greater than or equal to the predetermined number of frames.

11. The display method of claim 10, wherein the determining whether the image displayed by the bendable display screen is the static image further comprises the following step of:
restarting to count by the counter module when the image of the current frame and the image of the next frame are different.

12. The display method of claim 10, wherein the determining whether the image displayed by the bendable display screen is the static image further comprises the following step of:
determining that the image of the current frame is a non-static image when the number of frames that the image of the current frame is continuously displayed is smaller than the predetermined number of frames.

13. The display method of claim 10, wherein before the driving the bendable display screen to move relative to the housing of the display device by the retractable device, the display method further comprises the following step of:
outputting, by an output module, an instruction for activating the retractable device to the retractable device and outputting an instruction for changing the display position of the image in the bendable display screen to the bendable display screen, when the determination module determines that the image of the current frame is the static image.

14. The display method of claim 13, wherein the retractable device comprises rotation axes disposed at two opposite sides of the bendable display screen, and the rotation axes are connected to a rotating motor.

15. The display method of claim 14, wherein a method of the driving the bendable display screen to move by the retractable device comprises:
driving, by the rotating motor, the rotation axes to rotate by the rotating motor; and winding, by the rotation axes, the bendable display screen on the rotation axes.

16. The display method of claim 14, wherein a method of the driving the bendable display screen to move by the retractable device comprises:
driving, by the rotating motor, the rotation axes to rotate by the rotating motor; and releasing, by the rotation axes, the bendable display screen from the rotation axes.

17. A display device, comprising:
a housing; a bendable display screen disposed in the housing; a retractable device disposed in the housing, connected to the bendable display screen, and configured to wind or release the bendable display screen to implement movement of the bendable display screen relative to a housing of the display device; and a control module disposed in the housing and configured to determine whether an image displayed by the bendable display screen is a static image; wherein when the control module determines that the image displayed by the bendable display screen is the static image, the control module controls the retractable device to drive the bendable display screen to move relative to the housing of the display device, and the control module simultaneously controls a display position of the image in the bendable display screen moved, in a direction opposite to a moving direction of the bendable display screen, for a distance equal to a moving distance of the bendable display screen, so that a position of the image relative to the housing of the display device is fixed.

* * * * *